United States Patent
Yamagishi et al.

(10) Patent No.: US 7,021,881 B2
(45) Date of Patent: Apr. 4, 2006

(54) SEMICONDUCTOR PROCESSING APPARATUS COMPRISING CHAMBER PARTITIONED INTO REACTION AND TRANSFER SECTIONS

(75) Inventors: Takayuki Yamagishi, Tama (JP); Masaei Suwada, Tama (JP); Takeshi Watanabe, Tama (JP)

(73) Assignee: ASM Japan K.K., Tokyo (JP)

( * ) Notice: Subject to any disclaimer, the term of this patent is extended or adjusted under 35 U.S.C. 154(b) by 0 days.

(21) Appl. No.: 11/021,311

(22) Filed: Dec. 23, 2004

(65) Prior Publication Data

US 2005/0118001 A1 Jun. 2, 2005

Related U.S. Application Data

(63) Continuation of application No. 10/072,620, filed on Feb. 8, 2002, now Pat. No. 6,899,507.

(51) Int. Cl.
*B65G 49/07* (2006.01)
(52) U.S. Cl. .................. 414/217; 414/805; 414/939
(58) Field of Classification Search ............... 414/217, 414/217.1, 221, 939, 805
See application file for complete search history.

(56) References Cited

U.S. PATENT DOCUMENTS

| | | | |
|---|---|---|---|
| 4,797,054 A * | 1/1989 | Arii | ........................ 414/217 |
| 4,828,224 A | 5/1989 | Crabb et al. | |
| 4,889,609 A | 12/1989 | Cannella | |
| 4,895,107 A | 1/1990 | Yano et al. | |
| 4,949,783 A | 8/1990 | Lakios et al. | |
| 4,951,601 A | 8/1990 | Maydan et al. | |
| 4,990,047 A | 2/1991 | Wagner et al. | |
| 5,071,460 A | 12/1991 | Fujiura et al. | |
| 5,080,549 A | 1/1992 | Goodwin et al. | |
| 5,121,705 A | 6/1992 | Sugino | |
| 5,186,718 A | 2/1993 | Tepman et al. | |
| 5,192,371 A | 3/1993 | Shuto et al. | |
| 5,199,483 A | 4/1993 | Bahng | |
| 5,217,501 A | 6/1993 | Fuse et al. | |
| 5,223,001 A | 6/1993 | Saeki | |
| 5,229,615 A | 7/1993 | Brune et al. | |

(Continued)

FOREIGN PATENT DOCUMENTS

EP 0 209 150 1/1987

(Continued)

OTHER PUBLICATIONS

EPO Search Report for European Patent Application 0 325 0731, dated Nov. 3, 2004.

*Primary Examiner*—Dean J. Kramer
(74) *Attorney, Agent, or Firm*—Knobbe, Martens, Olson & Bear LLP

(57) ABSTRACT

Semiconductor processing equipment that has increased efficiency, throughput, and stability, as well as reduced operating cost, footprint, and faceprint is provided. Other than during deposition, the atmosphere of both the reaction chamber and the transfer chamber are evacuated using the transfer chamber exhaust port, which is located below the surface of the semiconductor wafer. This configuration prevents particles generated during wafer transfer or during deposition from adhering to the surface of the semiconductor wafer. Additionally, by introducing a purge gas into the transfer chamber during deposition, and by using an insulation separating plate 34, the atmospheres of the transfer and reaction chambers can be effectively isolated from each other, thereby preventing deposition on the walls and components of the transfer chamber. Finally, the configuration described herein permits a wafer buffer mechanism to be used with the semiconductor processing equipment, thereby further increasing throughput and efficiency.

31 Claims, 4 Drawing Sheets

U.S. PATENT DOCUMENTS

| | | | |
|---|---|---|---|
| 5,286,296 A | 2/1994 | Sato et al. |
| 5,388,944 A | 2/1995 | Takanabe et al. |
| 5,391,035 A | 2/1995 | Krueger |
| 5,433,785 A | 7/1995 | Saito |
| 5,462,397 A | 10/1995 | Iwabuchi |
| 5,516,732 A | 5/1996 | Flegal |
| 5,520,742 A | 5/1996 | Ohkase |
| 5,520,743 A | 5/1996 | Takahashi |
| 5,538,390 A | 7/1996 | Salzman |
| 5,571,330 A | 11/1996 | Kyogoku |
| 5,586,585 A | 12/1996 | Bonora et al. |
| 5,609,459 A | 3/1997 | Muka |
| 5,609,689 A | 3/1997 | Kato et al. |
| 5,611,655 A | 3/1997 | Fukasawa et al. |
| 5,613,821 A | 3/1997 | Muka et al. |
| 5,630,690 A | 5/1997 | Salzman |
| 5,651,868 A | 7/1997 | Canady et al. |
| 5,664,925 A | 9/1997 | Muka et al. |
| 5,683,072 A | 11/1997 | Ohmi et al. |
| 5,697,750 A | 12/1997 | Fishkin et al. |
| 5,730,801 A | 3/1998 | Tepman et al. |
| 5,752,796 A | 5/1998 | Muka |
| 5,784,799 A | 7/1998 | Kato et al. |
| 5,785,796 A | 7/1998 | Lee |
| 5,788,447 A | 8/1998 | Yonemitsu et al. |
| 5,810,538 A | 9/1998 | Ozawa et al. |
| 5,810,942 A | 9/1998 | Narayanswami et al. |
| 5,816,718 A | 10/1998 | Poole |
| 5,820,692 A | 10/1998 | Baecker et al. |
| 5,855,681 A | 1/1999 | Maydan et al. |
| 5,857,848 A | 1/1999 | Takahashi et al. |
| 5,879,459 A | 3/1999 | Gadgil et al. |
| 5,882,165 A | 3/1999 | Maydan et al. |
| 5,882,413 A | 3/1999 | Beaulieu et al. |
| 5,883,017 A | 3/1999 | Tepman et al. |
| 5,885,675 A | 3/1999 | Martin |
| 5,897,710 A | 4/1999 | Sato et al. |
| 5,900,105 A | 5/1999 | Toshima |
| 5,913,978 A | 6/1999 | Kato et al. |
| 5,934,856 A | 8/1999 | Asakawa et al. |
| 5,970,717 A | 10/1999 | Tateyama |
| 5,974,682 A | 11/1999 | Akimoto |
| 5,975,740 A | 11/1999 | Lin et al. |
| 5,976,312 A | 11/1999 | Shimizu et al. |
| 6,000,227 A | 12/1999 | Kroeker |
| 6,022,586 A | 2/2000 | Hashimoto et al. |
| 6,042,623 A | 3/2000 | Edwards |
| 6,045,315 A | 4/2000 | Azumano et al. |
| 6,048,154 A | 4/2000 | Wytman |
| 6,053,686 A | 4/2000 | Kyogoku |
| 6,053,980 A | 4/2000 | Suda et al. |
| 6,063,203 A | 5/2000 | Satoh |
| 6,071,055 A | 6/2000 | Tepman |
| 6,073,366 A | 6/2000 | Aswad |
| 6,074,538 A | 6/2000 | Ohmi et al. |
| 6,096,135 A | 8/2000 | Guo et al. |
| 6,106,634 A | 8/2000 | Ghanayem et al. |
| 6,108,937 A | 8/2000 | Raaijmakers |
| 6,113,704 A | 9/2000 | Satoh et al. |
| 6,120,605 A | 9/2000 | Sato |
| 6,149,365 A * | 11/2000 | White et al. ............... 414/217 |
| 6,154,301 A | 11/2000 | Harvey |
| 6,162,299 A | 12/2000 | Raaijmakers |
| 6,193,803 B1 | 2/2001 | Sato et al. |
| 6,224,312 B1 | 5/2001 | Sundar |
| 6,224,679 B1 | 5/2001 | Sasaki et al. |
| 6,234,107 B1 | 5/2001 | Tanaka et al. |
| 6,236,903 B1 | 5/2001 | Kim et al. |
| 6,261,048 B1 | 7/2001 | Muka |
| 6,264,804 B1 | 7/2001 | Lee et al. |
| 6,280,134 B1 | 8/2001 | Nering |
| 6,283,060 B1 | 9/2001 | Yamazaki et al. |
| 6,286,230 B1 | 9/2001 | White et al. |
| 6,305,898 B1 | 10/2001 | Yamagishi et al. |
| 6,312,525 B1 | 11/2001 | Bright et al. |
| 6,464,825 B1 | 10/2002 | Shinozaki |
| 6,488,775 B1 | 12/2002 | Shimizu et al. |
| 6,488,778 B1 | 12/2002 | Ballantine et al. |
| 6,536,136 B1 | 3/2003 | Saga |
| 6,551,045 B1 | 4/2003 | Binnard et al. |
| 6,609,869 B1 | 8/2003 | Aggarwal et al. |
| 6,709,521 B1 | 3/2004 | Hiroki |
| 2001/0041122 A1 | 11/2001 | Kroeker |
| 2003/0160239 A1 | 8/2003 | Shinagawa et al. |
| 2003/0219977 A1 | 11/2003 | Pomarede et al. |

FOREIGN PATENT DOCUMENTS

| | | |
|---|---|---|
| EP | 1 139 393 A2 | 4/2001 |
| JP | 06-275703 | 9/1994 |
| WO | WO 94/14185 | 6/1994 |
| WO | WO 01/04935 | 1/2001 |

* cited by examiner

SEMICONDUCTOR PROCESSING APPARATUS COMPRISING CHAMBER PARTITIONED INTO REACTION AND TRANSFER SECTIONS

PRIORITY APPLICATION

This application is a continuation of application Ser. No. 10/072,620, filed 8 Feb. 2002 U.S. Pat. No. 6,899,507, which is hereby incorporated by reference herein in its entirety.

FIELD OF THE INVENTION

The present invention generally relates to vacuum load lock semiconductor processing equipment, and more specifically relates to compact single-wafer processing semiconductor processing equipment that can efficiently process wafers continuously or simultaneously.

BACKGROUND OF THE INVENTION

Generally, a semiconductor processing apparatus that uses a vacuum load lock system includes a load lock chamber, a transfer chamber and multiple reaction chambers that are connected to the transfer chamber. For each apparatus, a substrate-handling robot is used to automatically supply substrates to the reaction chambers. In such an arrangement, an atmospheric robot first brings a substrate inside the load lock chamber from a cassette or a front opening unified pod ("FOUP"). The FOUP may comprise a detachable cassette and a box with a front-opening interface. After the substrates are placed in the load lock chamber, the load lock chamber is evacuated, and the substrate is transferred to a reaction chamber by a vacuum robot provided inside a common polygon-shaped transfer chamber. After the substrate is fully processed in the reaction chamber, it is returned to the load lock chamber by the vacuum robot. Lastly, after the load lock chamber is restored to atmospheric pressure, the processed substrate returned to the cassette or the FOUP by the atmospheric robot. This type of apparatus is generally called a "cluster tool."

As the number of reaction chambers increases, the area occupied by the processing apparatus (the "footprint") and the width of the front panel of the apparatus (the "faceprint") increase, as does the cost of operation. This is because the conventional single-wafer processing apparatus possesses a common polygon-shaped transfer chamber to which each of the reaction chambers is attached, radiating in all directions. Additionally, the number of reaction chambers in a layout is limited by the number of sides of the polygon-shaped transfer chamber. Furthermore, in the conventional single-wafer processing apparatus, each reaction chamber has independent gas and vacuum lines, and each reaction chamber independently performs deposition (film forming). Thus, if the number of reaction chambers is to be increased to improve productivity, the number of gas lines and vacuum pumps must increase as well, thereby increasing the complexity of the processing apparatus.

To reduce the footprint or the faceprint of the conventional single-wafer processing apparatus, a transfer mechanism has been included inside the load lock chamber. The transfer mechanism is simply a handling unit capable of holding substrates and loading/unloading substrates from the reaction chamber. The load lock chamber is separated from the reaction chamber using a gate valve. This configuration allows the footprint or faceprint of the processing apparatus to be reduced to a certain degree, but the reduction is not satisfactory, no improvement of process efficiency or productivity is made, and the total system is generally not simplified. Furthermore, this configuration makes it difficult to supply wafers to the reaction chambers in a continuous chemical vapor deposition ("CVD") process, such as in an ashing process. Finally, during deposition a film is apt to form around the gate valve, thereby necessitating installation of an expensive plasma-proof O-ring for CVD processes using plasma.

Although incorporation of a W-shaped transfer arm into the load lock chamber may solve some of these problems, so doing increases the capacity of the load lock chamber, thereby increasing the time required for evacuating and pressurizing the load lock chamber and thus decreasing processing capacity.

SUMMARY OF THE INVENTION

One object of the present invention is to provide semiconductor processing equipment that realizes low cost, small footprint, small faceprint, stable process and high throughput.

Another object of the present invention is to reduce the volume of the reaction chambers to reduce gas consumption and to reduce deposition on the reaction chamber walls.

According to one aspect of the present invention, the semiconductor processing equipment comprises a load lock chamber, a transfer chamber situated next to the load lock chamber, and a reaction chamber situated above the transfer chamber. The semiconductor processing equipment further comprises a thin link wafer transfer arm capable of operating in vacuum, and capable of transferring wafers between the respective chambers.

According to another aspect of the present invention, the load lock chamber, the transfer chamber and the reaction chamber each have respective exhaust ports. In such a configuration air is evacuated from the transfer chamber and the reaction chamber by switching between the exhaust port of the transfer chamber and the exhaust port of the reaction chamber.

According to another aspect of the present invention, during deposition and cleaning, the atmosphere of the transfer chamber is effectively separated from the atmosphere of the reaction chamber by an insulation separating plate, and by pressurizing the transfer chamber with an inactive gas. This configuration prevents the reaction gas in the reaction chamber from flowing into the transfer chamber. Furthermore, the presence of separate exhaust ports for the reaction chamber and the transfer chamber facilitates the cleaning of the transfer chamber.

According to another aspect of the present invention, an insulating material is used to comprise an exhaust duct which also functions as a reaction chamber side wall. This configuration reduces plasma deposition on the interior walls of the reaction chamber.

According to another aspect of the present invention, the transfer chamber is positioned below the reaction chamber, thereby preventing the formation of a film around the gate valve that separates the load lock chamber from the transfer chamber. This configuration further allows deposition on multiple wafers without the generation of foreign contaminating substances.

According to another aspect of the present invention, the transfer chamber is positioned below the reaction chamber, thereby making it possible to install a temporary storing mechanism for wafers adapted to increase the overall throughput of the semiconductor processing equipment. Additional details on the wafer buffer mechanism are provided in U.S. patent application Ser. No. 10/187,670, filed 1 Jul. 2002.

According to another aspect of the present invention, the reaction chamber is evacuated from a position below the surface of a semiconductor wafer being transferred into the reaction chamber, thereby reducing the adhesion of particles that may be generated when a semiconductor wafer is transferred into the transfer chamber or during deposition. Furthermore, this configuration provides a smaller reaction chamber, thereby increasing the efficiency of the semiconductor processing equipment.

BRIEF DESCRIPTION OF THE DRAWINGS

These and other features of this invention will now be described with reference to the drawings of preferred embodiments which are intended to illustrate and not to limit the invention.

DETAILED DESCRIPTION OF THE PREFERRED EMBODIMENTS

Figure 1A:
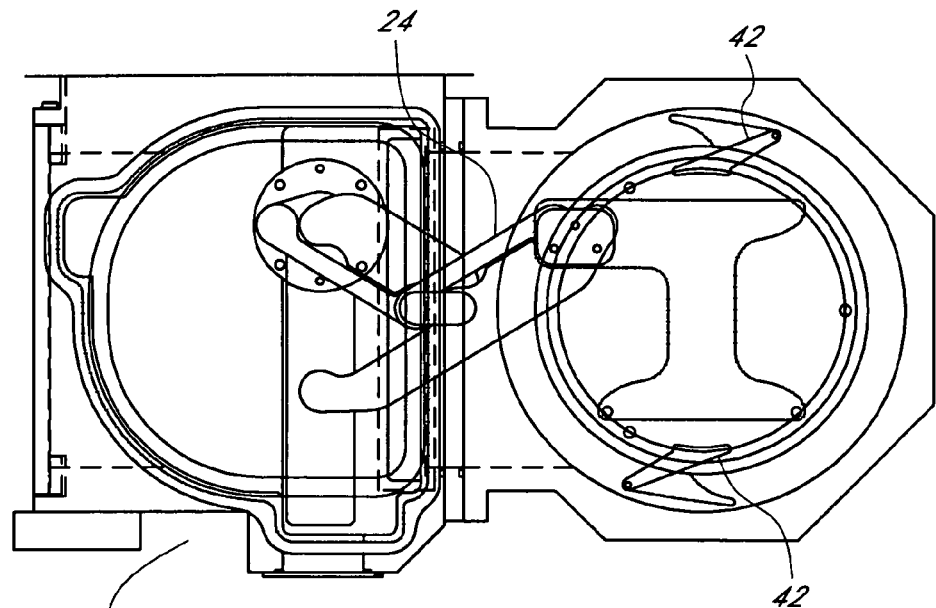
FIG. 1A is a layout view schematically illustrating the configuration of the load lock chamber, the transfer chamber and the reaction chamber according to one embodiment of the present invention.
Figure 1B:
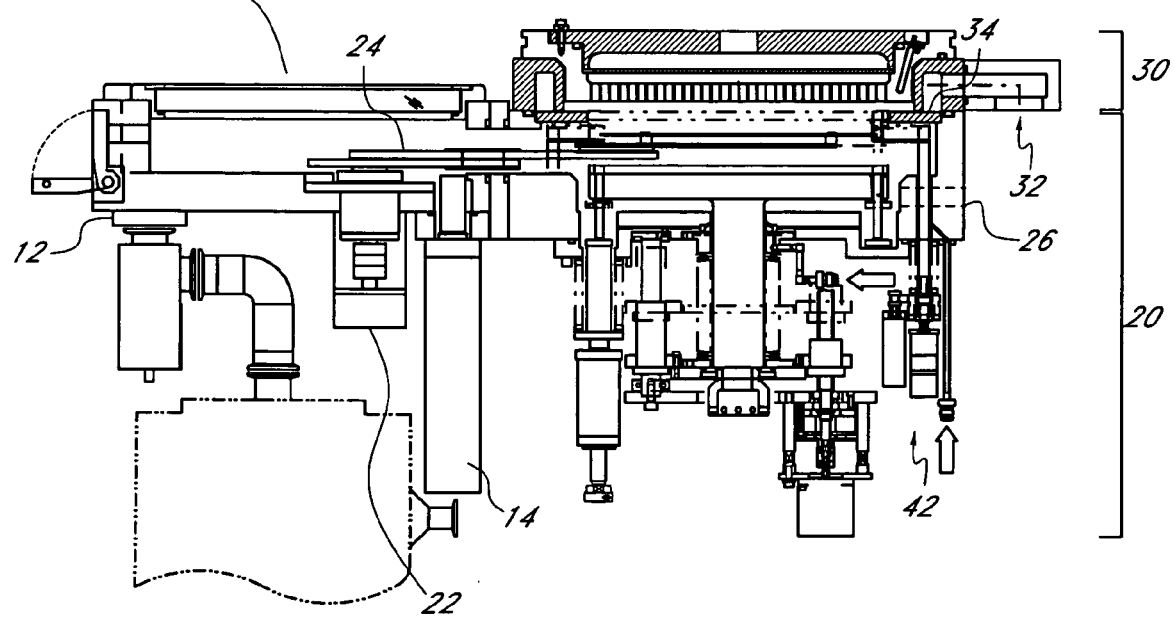
FIG. 1B is a cross-sectional view schematically illustrating the configuration of the load lock chamber, the transfer chamber and the reaction chamber in one embodiment of the present invention.

FIGS. 1 through 4 schematically illustrate one embodiment of semiconductor processing equipment that uses a vacuum load lock system. The embodiment comprises a load lock chamber 10 adapted to queue semiconductor wafers 40 before processing, a transfer chamber 20 and a reaction chamber 30 for growing a film on semiconductor wafers 40. The transfer chamber 20 is positioned adjacent to the load lock chamber 10, and the reaction chamber 30 is positioned above the transfer chamber 20. A transfer robot 22 is positioned outside the load lock chamber 10, and comprises a thin link wafer transfer arm 24 capable of transferring semiconductor wafers 40 from the transfer robot 22 to the load lock chamber 10, the transfer chamber 20, and the reaction chamber 30.

In such embodiments, the load lock chamber 10 further comprises a load lock exhaust port 12, the transfer chamber 20 further comprises a transfer exhaust port 26, and the reaction chamber 30 further comprises a reaction exhaust port 32. These exhaust ports allow the transfer chamber 20 and the reaction chamber 30 to be evacuated.

During a semiconductor wafer deposition process, and during cleaning of the semiconductor processing equipment, the atmosphere of the transfer chamber 20 is effectively isolated from the atmosphere of the reaction chamber 30. This isolation is accomplished through by using an insulation separating plate 34, and by bringing an inactive gas into the transfer chamber 20. These steps prevent the reaction gas present in the reaction chamber 30 from flowing into the transfer chamber 20.

Additionally, an insulating material may be used to comprise the reaction exhaust port 32, and the side walls of the reaction chamber 30. This configuration reduces plasma deposition on the reaction chamber side walls, thereby increasing the efficiency of the semiconductor processing equipment and reducing the cleaning costs associated with operation of the equipment.

Furthermore, placing the transfer chamber 20 below the reaction chamber 30 provides multiple advantages. For example this configuration reduces the formation of film around the gate valve 14 that separates the transfer chamber 20 from the load lock chamber 10, thereby allowing deposition on multiple semiconductor wafers 40 without generating contaminating substances. Additionally, this configuration permits installation of a wafer buffer mechanism 42, that can be used in the transfer of semiconductor wafers 40 between the load lock chamber and the transfer chamber 20. Additional details of the wafer buffer mechanism 42 are available in U.S. patent application Ser. No. 10/187,670, filed 1 Jul. 2002.

By evacuating the reaction chamber 30 from below the surface of a semiconductor wafer 40 that is being transferred from the transfer chamber, the adhesion of particles generated during wafer transfer or during deposition is reduced or prevented. Furthermore, this exhausting configuration allows the reaction chamber to be made smaller. By switching the active exhaust port from the transfer chamber 20 to the reaction chamber 30, and by feeding a purge gas into the transfer chamber 20, the flow of reaction gas into the transfer chamber 20 is prevented. During cleaning, this same gas flow configuration may be used, although cleaning may be performed using the transfer exhaust port, thereby enabling the cleaning of the interior of the transfer chamber 20.

Figure 2:
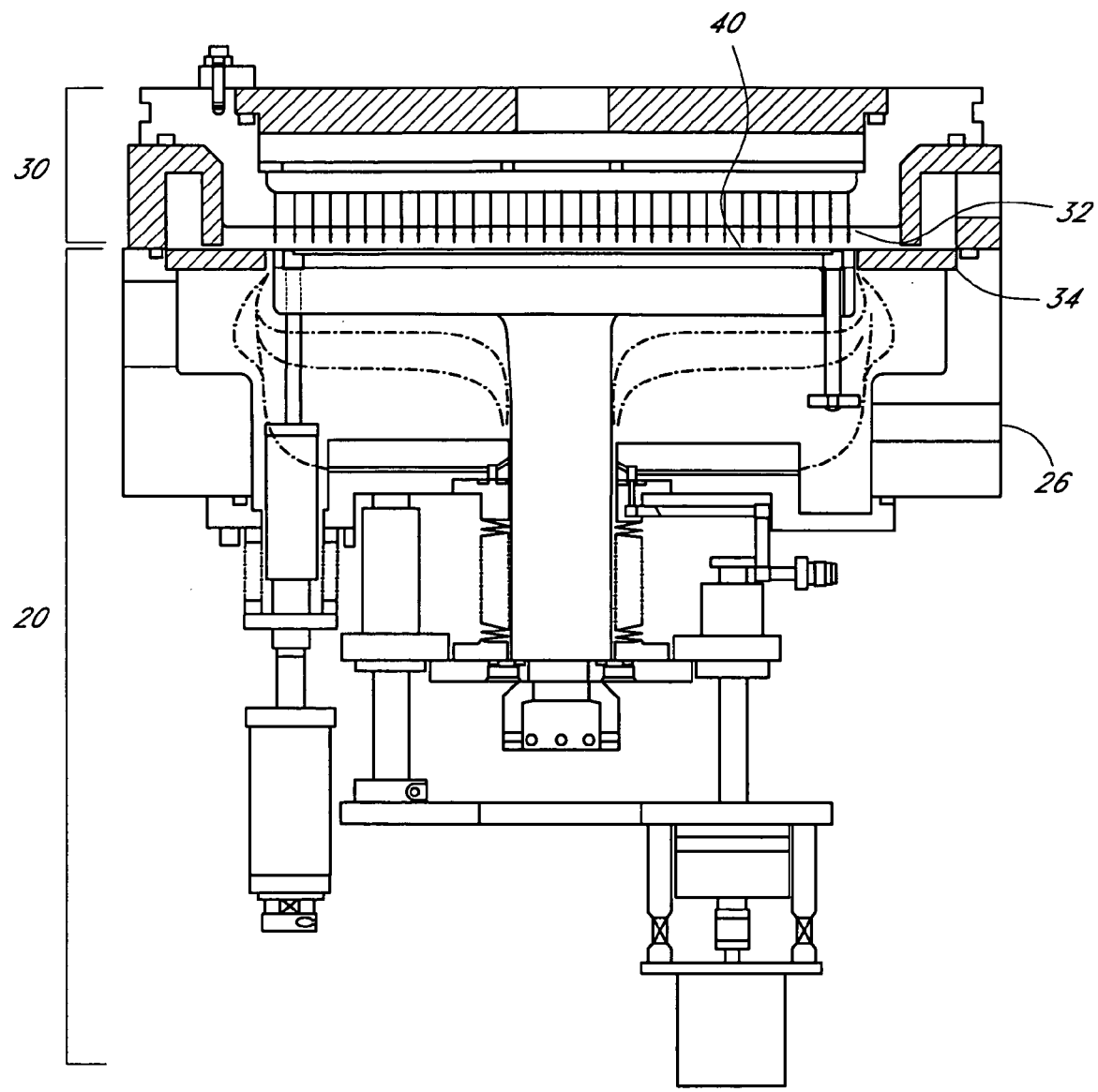
FIG. 2 is a cross-sectional view schematically illustrating the configuration of one embodiment of the present invention during deposition.

FIG. 2 schematically illustrates one embodiment of the mechanism that prevents the reaction gas in the reaction chamber 30 from flowing Into the transfer chamber 20. In such embodiments, an inactive gas is introduced into the transfer chamber 20 during deposition, thereby effectively isolating the transfer chamber 20 from the reaction chamber 30. Therefore, during deposition, both the reaction chamber 30 and the transfer chamber 20 are exhausted through the reaction chamber exhaust port 32.

Figure 3:
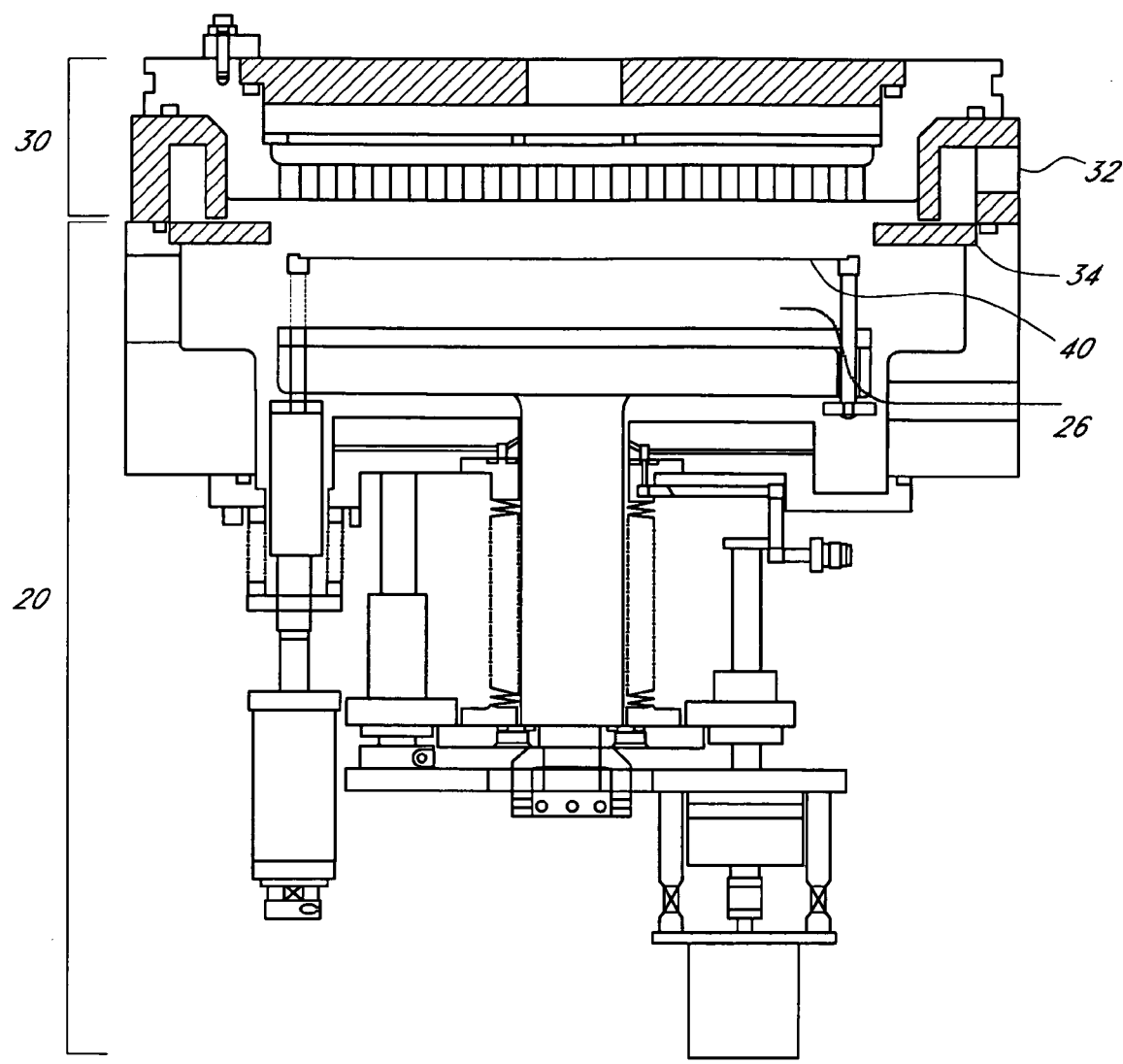
FIG. 3 is a cross-sectional view schematically illustrating the configuration of one embodiment of the present invention during wafer transfer from the reaction chamber.

As illustrated in FIG. 3, when a semiconductor wafer 40 is transferred to the reaction chamber 30, or is being queued in the transfer chamber 20, the atmosphere of the reaction chamber 30 is evacuated from the transfer exhaust port 26, which is located below the surface of the semiconductor wafer 40. This configuration prevents particles generated during wafer transfer or during deposition from adhering to the surface of the semiconductor wafer 40.

Figure 4:
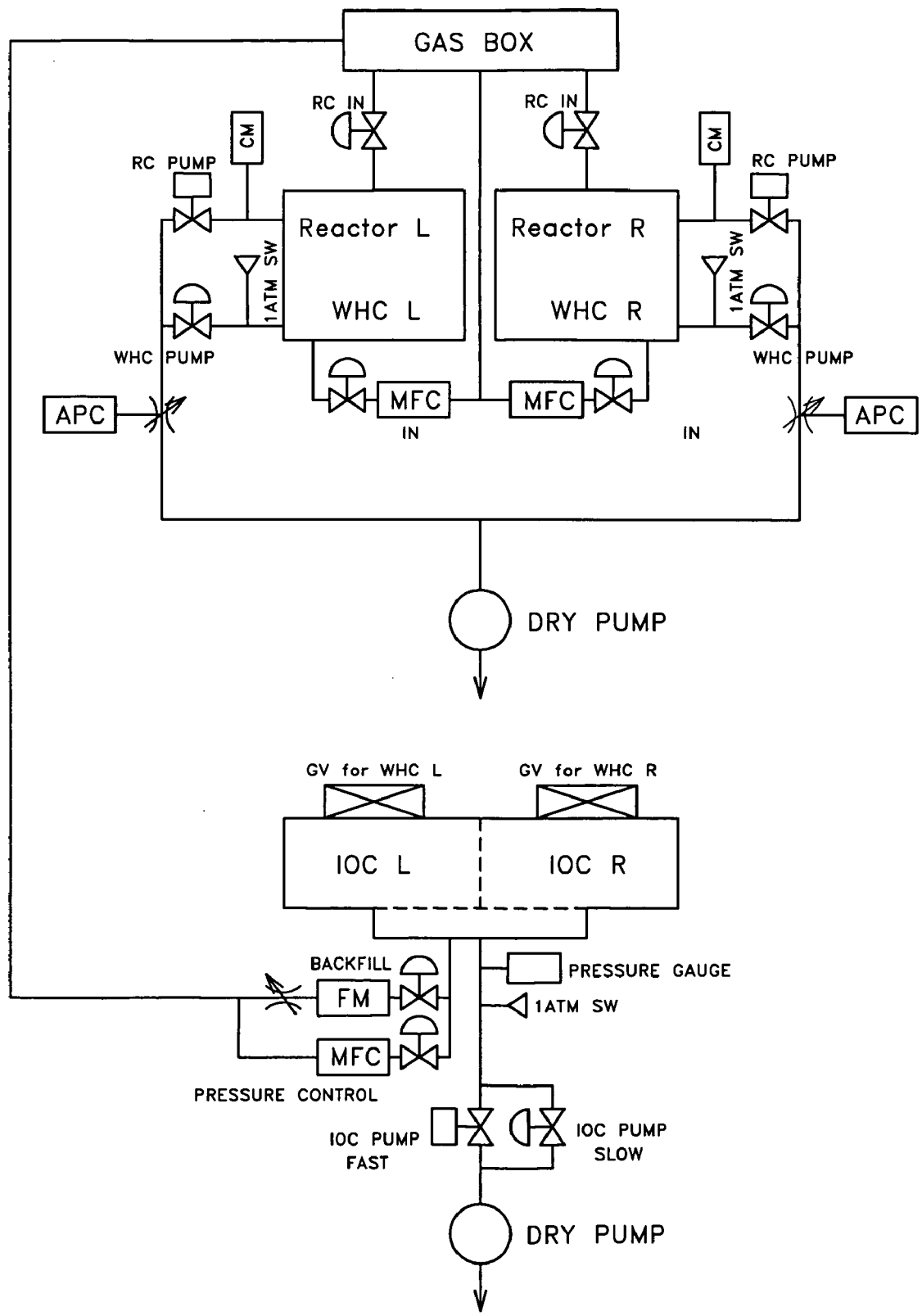
FIG. 4 is schematic illustration of the gas and vacuum lines according to one embodiment of the present invention.

FIG. 4 schematically illustrates the configuration of the gas and vacuum lines according to one embodiment of the present invention.

The semiconductor processing equipment according to the embodiments described above features reduced operating cost, footprint, and faceprint. Additionally, by reducing the capacity of the reaction chamber 30, and by comprising the reaction chamber walls of an insulating material, deposition on the walls of the reaction chamber 30 is minimized, thereby allowing this equipment to be operated with increased efficiency, throughput, and stability.

The invention claimed is:

1. A method of processing a semiconductor wafer, the method comprising:

providing a load lock chamber, a transfer chamber, and a reaction chamber that is located above the transfer chamber;

moving the semiconductor wafer from the load lock chamber to the transfer chamber, and from the transfer chamber to the reaction chamber;

exhausting the reaction chamber and the transfer chamber through a transfer chamber exhaust port during a first period;

exhausting the reaction chamber and the transfer chamber through a reaction chamber exhaust port during a second period, wherein the semiconductor wafer undergoes a wafer processing operation in the reaction chamber during the second period.

2. The method of claim 1, further comprising closing the transfer chamber exhaust port after the first period and before the second period.

3. The method of claim 1, further comprising:

introducing an inactive gas into the transfer chamber during the wafer processing operation;

flowing the inactive gas from the transfer chamber to the reaction chamber during the wafer processing operation; and exhausting the inactive gas through the reaction chamber exhaust port during the wafer processing operation.

4. The method of claim 1, further comprising providing an insulating material on an interior surface of the reaction chamber.

5. The method of claim 1, further comprising pressurizing the transfer chamber with an inactive gas during the wafer processing operation.

6. The method of claim 1, further comprising switching an active exhaust port from the transfer chamber exhaust port to the reaction chamber exhaust port before the wafer processing operation.

7. The method of claim 1, wherein the transfer chamber exhaust port is lower than the semiconductor wafer.

8. The method of claim 1, wherein deposition on an interior surface of the transfer chamber is reduced by isolating the transfer chamber from the reaction chamber.

9. An apparatus for processing a semiconductor wafer, the apparatus comprising:

a load lock chamber;

a transfer chamber having a transfer chamber exhaust port that is positioned lower than a wafer processing position, wherein the transfer chamber is configured to exhaust gases from within the transfer chamber and a reaction chamber out of the transfer chamber exhaust port before a wafer processing operation; and a wafer transfer arm that is adapted to transfer the semiconductor wafer between the load lock chamber, the transfer chamber and the reaction chamber;

wherein the reaction chamber is located above the transfer chamber, and the reaction chamber is configured to exhaust gases from within the reaction chamber and the transfer chamber out of a reaction chamber exhaust port during the wafer processing operation.

10. The apparatus of claim 9, further configured to supply an inert gas to the transfer chamber during the wafer processing operation, and to exhaust the inert gas around the semiconductor wafer, into the reaction chamber, and out of the reaction chamber exhaust port during the wafer processing operation.

11. The apparatus of claim 9, further configured to switch an active exhaust port from the transfer chamber exhaust port to the reaction chamber exhaust port before the wafer processing operation.

12. The apparatus of claim 9, wherein an insulating material is disposed on an interior surface of the reaction chamber.

13. The apparatus of claim 9, wherein there is no seal between the transfer chamber and the reaction chamber.

14. The apparatus of claim 9, wherein the reaction chamber is located completely above the transfer chamber.

15. A wafer processing apparatus comprising:

a load lock chamber;

a transfer chamber having a transfer chamber exhaust port configured to exhaust the transfer chamber before a wafer processing operation; and a reaction chamber having a reaction chamber exhaust port configured to exhaust the transfer chamber during the wafer processing operation, wherein the reaction chamber is configured to hold a semiconductor wafer in a processing position that is above the transfer chamber exhaust port during the wafer processing operation.

16. The wafer processing apparatus of claim 15, further comprising a wafer transfer arm configured to move the semiconductor wafer from the load lock chamber to the transfer chamber, and from the transfer chamber to the reaction chamber.

17. The wafer processing apparatus of claim 15, further configured to switch an active exhaust port from the transfer chamber exhaust port to the reaction chamber exhaust port before the wafer processing operation.

18. The wafer processing apparatus of claim 15, wherein the reaction chamber exhaust port is also configured to exhaust the reaction chamber during the wafer processing operation.

19. The wafer processing apparatus of claim 15, further comprising an insulation separating plate positioned between the transfer chamber and the reaction chamber.

20. The wafer processing apparatus of claim 15, further comprising an insulation separating plate positioned between the transfer chamber and the reaction chamber, wherein the insulation separating plate has an opening larger than the semiconductor wafer, and wherein the semiconductor wafer sits in the opening during the wafer processing operation.

21. The wafer processing apparatus of claim 15, further comprising an insulating material provided on an interior surface of the reaction chamber.

22. A method comprising:

moving a semiconductor wafer from a load lock chamber to a transfer chamber using a wafer transfer arm;

moving the semiconductor wafer from the transfer chamber to a reaction chamber;

exhausting gases from the reaction chamber and the transfer chamber through a transfer chamber exhaust port that is positioned below the semiconductor wafer before a wafer processing operation;

performing a wafer processing operation while the semiconductor wafer is in the reaction chamber; and exhausting the reaction chamber and the transfer chamber through a reaction chamber exhaust port during the wafer processing operation.

23. The method of claim 22, further comprising supplying an inert gas to the transfer chamber during the wafer processing operation.

24. The method of claim 22, further comprising:

supplying an Inert gas to the transfer chamber during the wafer processing operation; and exhausting the inert gas from the transfer chamber, around edges of the semiconductor wafer, into the reaction chamber, and out of the reaction chamber exhaust port during the wafer processing operation.

25. The method of claim 22, further comprising providing an insulating material on an interior surface of the reaction chamber.

26. The method of claim 22, wherein an insulation separating plate is provided between the transfer chamber and the reaction chamber.

27. The method of claim 22, further comprising switching an active exhaust port from the transfer chamber exhaust port to the reaction chamber exhaust port.

28. A method comprising:
    moving a semiconductor wafer from a load lock chamber to a transfer chamber using a wafer transfer arm;
    holding the semiconductor wafer in a transfer holding position in the transfer chamber;
    exhausting gases from a reaction chamber and the transfer chamber through a transfer chamber exhaust port that is positioned below the transfer holding position;
    moving the semiconductor wafer from the transfer chamber to the reaction chamber;
    supplying an inert gas to the transfer chamber; and
    exhausting the reaction chamber and the transfer chamber through a reaction chamber exhaust port during a wafer processing operation.

29. The method of claim 28, further comprising providing an insulating material on an interior surface of the reaction chamber.

30. The method of claim 28, wherein an insulation separating plate is provided between the transfer chamber and the reaction chamber.

31. The method of claim 28, further comprising switching an active exhaust port from the transfer chamber exhaust port to the reaction chamber exhaust port.

* * * * *